(12) United States Patent
Shahar et al.

(10) Patent No.: US 10,147,826 B2
(45) Date of Patent: Dec. 4, 2018

(54) RADIATION DETECTOR HAVING PIXELATED ANODE STRIP-ELECTRODES

(71) Applicant: General Electric Company, Schenectady, NY (US)

(72) Inventors: Arie Shahar, Moshav Magshimim (IL); Jean-Paul Bouhnik, Zichron Yaakov (IL)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 15/398,033

(22) Filed: Jan. 4, 2017

(65) Prior Publication Data

US 2018/0190842 A1  Jul. 5, 2018

(51) Int. Cl.
| | |
|---|---|
| *G01J 1/42* | (2006.01) |
| *H01L 31/0224* | (2006.01) |
| *H01L 31/18* | (2006.01) |
| *H01L 31/0296* | (2006.01) |
| *G01T 1/24* | (2006.01) |

(52) U.S. Cl.
CPC ...... *H01L 31/022408* (2013.01); *G01T 1/241* (2013.01); *G01T 1/247* (2013.01); *H01L 31/02966* (2013.01); *H01L 31/1832* (2013.01)

(58) Field of Classification Search
CPC ................................. G01T 1/241; H01L 21/00
See application file for complete search history.

(56) References Cited

U.S. PATENT DOCUMENTS

| | | | | |
|---|---|---|---|---|
| 6,037,595 | A * | 3/2000 | Lingren | ............ G01T 1/241 250/370.01 |
| 2008/0169422 | A1 | 7/2008 | Shahar et al. | |
| 2015/0200323 | A1 | 7/2015 | Doki et al. | |
| 2016/0126402 | A1 | 5/2016 | Shahar et al. | |

OTHER PUBLICATIONS

"Characterization of Single-Sided CdZnTe StripDetectors for High Energy Astrophysics Applications" to Donmez (2006), available at: http://astrophysics.sr.unh.edu/files/2006_Donmez_PhD_thesis.pdf.
*

(Continued)

*Primary Examiner* — Kenneth J Malkowski
(74) *Attorney, Agent, or Firm* — Fletcher Yoder, P.C.

(57) ABSTRACT

A radiation detection system is provided. The radiation detection system includes a radiation detector. The radiation detector includes a semiconductor layer having a first surface and a second surface opposite the first surface, a monolithic cathode disposed on the first surface, and multiple pixelated anode strip-electrodes disposed on the second surface in a coplanar arrangement. The multiple pixelated anode strip-electrodes include a first set of pixelated anode strip-electrodes disposed along a first direction and a second set of pixelated anode strip-electrodes disposed along a second direction orthogonal to the first direction. Each pixelated anode strip-electrode of the first set of pixelated anode strip-electrodes includes a first respective multiple segments disposed along the first direction. Each pixelated anode strip-electrode of the second set of pixelated anode strip-electrodes includes a second respective multiple segments disposed along the second direction.

9 Claims, 10 Drawing Sheets

(56) References Cited

OTHER PUBLICATIONS

Macri, J.R., et al., "Single-sided CZT strip detectors," IEEE Transactions on Nuclear Science, vol. 5501, Issue 5, pp. 208-217 (Oct. 18, 2004).
Extended European Search Report and Opinion issued in connection with corresponding EP Application No. 17208861.9 dated May 17, 2018.

* cited by examiner

RADIATION DETECTOR HAVING PIXELATED ANODE STRIP-ELECTRODES

BACKGROUND

The subject matter disclosed herein relates to a radiation detector and, more particularly, a radiation detector having pixelated anode strip-electrodes.

A semiconductor radiation detector may be used to detect photons for medical imaging systems, such as, Computed Tomography (CT), gamma camera, Single Photon Emission Computed Tomography (SPECT), Molecular Breast Imaging (MBI) and Positron Emission Tomography. Photons of ionizing radiation, e.g., X-ray or gamma ray radiation, are absorbed by a semiconductor and generate measurable electric charge, which may be collected by anodes (e.g., pixels) deposited on the semiconductor. The electric charge collected by the anodes may be read and converted into electric signals by readout circuits coupled to the anodes. The energy of the absorbed photon is measured according to the energy level of the electric signals, and the location of absorption of the photon corresponds to the location of the anodes collecting the electric charge. The energy level and location of the absorbed photons are used for image reconstruction.

BRIEF DESCRIPTION

Certain embodiments commensurate in scope with the originally claimed subject matter are summarized below. These embodiments are not intended to limit the scope of the claimed subject matter, but rather these embodiments are intended only to provide a brief summary of possible forms of the subject matter. Indeed, the subject matter may encompass a variety of forms that may be similar to or different from the embodiments set forth below.

In a first embodiment, a radiation detection system is provided. The radiation detection system includes a radiation detector. The radiation detector includes a semiconductor layer having a first surface and a second surface opposite the first surface, a monolithic cathode disposed on the first surface, and multiple pixelated anode strip-electrodes disposed on the second surface in a coplanar arrangement. The multiple pixelated anode strip-electrodes include a first set of pixelated anode strip-electrodes disposed along a first direction and a second set of pixelated anode strip-electrodes disposed along a second direction orthogonal to the first direction. At least one of the first set of pixelated anode strip-electrodes or the second set of pixelated anode strip-electrodes has each pixelated anode strip-electrode including a respective multiple segments disposed along its respective direction. The radiation detection system also includes an electrical connection and distribution plate coupled to the radiation detector and configured to electrically connect the multiple pixelated anode strip-electrodes to electronic channels. The electrical connection and distribution plate includes a first multiple of pads having interconnects disposed on a first plate surface and configured to electrically interconnect the respective multiple segments for each respective pixelated anode strip-electrode having the respective multiple segments.

In accordance with a second embodiment, a radiation detection system is provided. The radiation detection system includes a radiation detector. The radiation detector includes a semiconductor layer having a first surface and a second surface opposite the first surface, a monolithic cathode disposed on the first surface, and multiple pixelated anode strip-electrodes disposed on the second surface in a coplanar arrangement. The multiple pixelated anode strip-electrodes include a first set of pixelated anode strip-electrodes disposed along a first direction and a second set of pixelated anode strip-electrodes disposed along a second direction orthogonal to the first direction. Each pixelated anode strip-electrode of the first set of pixelated anode strip-electrodes includes a first respective multiple segments disposed along the first direction. Each pixelated anode strip-electrode of the second set of pixelated anode strip-electrodes includes a second respective multiple segments disposed along the second direction.

In accordance with a third embodiment, a method of forming a radiation detection system is provided. The method includes providing a semiconductor layer having a first surface and a second surface opposite the first surface. The method also includes applying a monolithic cathode on the first surface and applying multiple pixelated anode strip-electrodes on the second surface in a coplanar arrangement. The multiple pixelated anode strip-electrodes include a first set of pixelated anode strip-electrodes disposed along a first direction and a second set of pixelated anode strip-electrodes disposed along a second direction orthogonal to the first direction. Each pixelated anode strip-electrode of the first set of pixelated anode strip-electrodes includes a first respective multiple segments disposed along the first direction. Each pixelated anode strip-electrode of the second set of pixelated anode strip-electrodes includes a second respective multiple segments disposed along the second direction.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
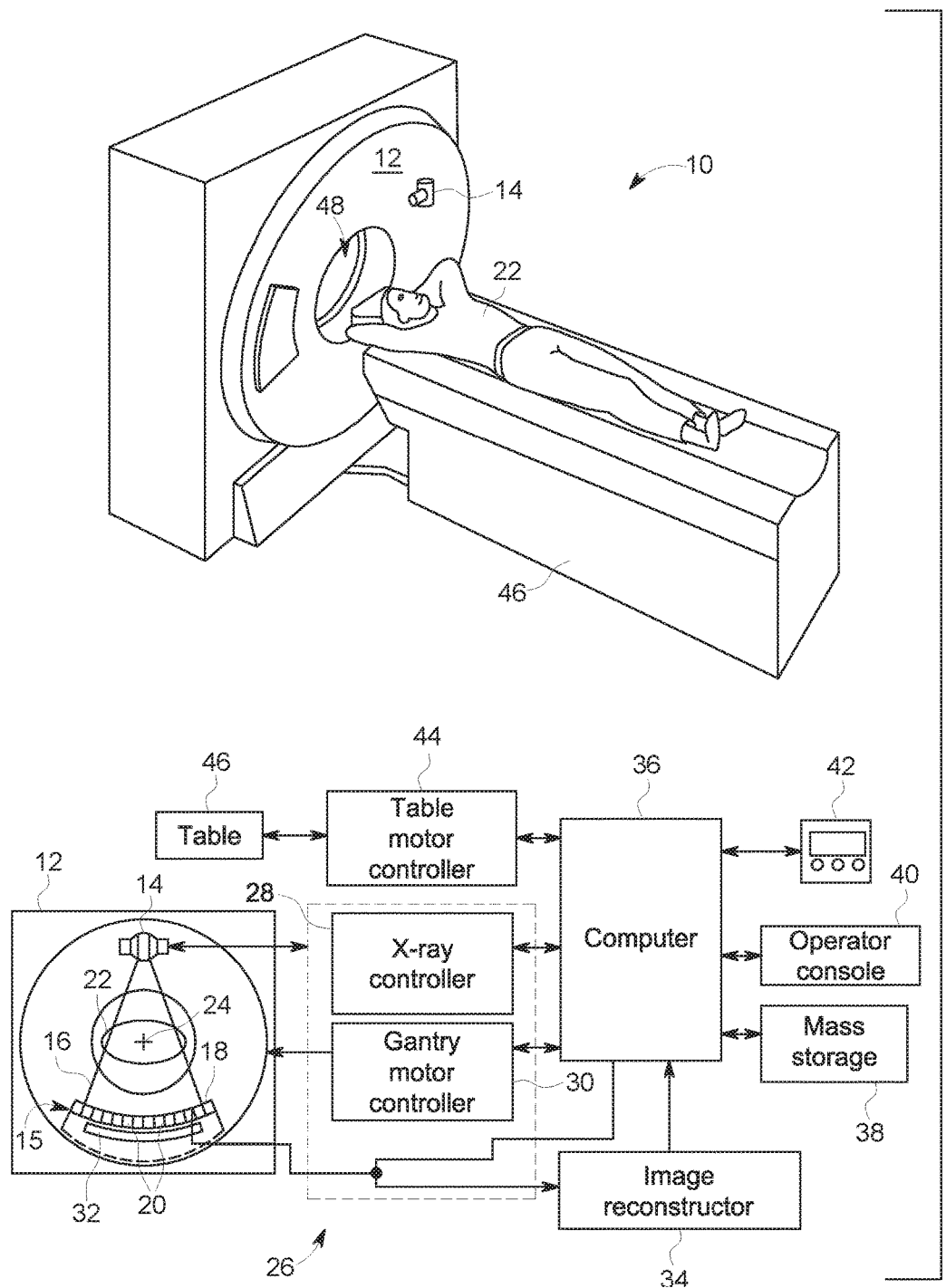
FIG. 1 is a combined pictorial view and block diagram of a computed tomography (CT) imaging system as discussed herein.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

Various embodiments provide systems and methods for improving performance of radiation detectors (e.g., direction conversion detectors such as semiconductor radiation detectors). The radiation detectors include anode electrodes (e.g., pixels) disposed as coplanar strips on one side of the detector with a first set of strips disposed along a first direction and a second set of strips divided along a second direction orthogonal to the first direction. The coplanar strips of one of or both of the sets of anode electrodes may be divided into a plurality of segments along the respective direction (e.g., first direction or second direction). The utilization of the coplanar strips of anode electrodes (having a small pixel pitch) enables the reduction in the pixel size of the detector, thus, improving the detector-energy resolution and the system spatial-resolution (especially for imaging at short distances from a collimator), while reducing the number of electronic channels (e.g., application specific integrated circuits (ASICs)) on an electronic board of the detector module. Dividing the coplanar strips of anode electrodes (e.g., pixelated anode strip electrodes) into segments reduces the area along the strips and the leakage current associated therewith. In addition, the small pitch pixels improve the sensitivity of the detector and reduces the area between the strips and the leakage current associated therewith. Further, utilizing neighbor summing enables charge-share recovery to counter the charge sharing between the small pitch pixels. Even further, grouping multiple strips together (from the first set, second set, or both sets) into virtual pixels enables the counting of events (an event corresponding to an absorption of a radiation photon by the semiconductor layer) within the virtual pixel to the virtual pixel (as opposed to the individual pixels within the virtual pixel) to reduce excess information and statistical noise. In other words, the pitch of the anode strips (pixels) may be selected to be very small to ensure small area corresponding to each of the anode strips. The area that is corresponding to an anode strip is selected to be small in order to maintain low leakage current in the anode strips. Reducing the leakage current in the anodes improves the Signal-to-Noise-Ration (SNR) of each event measured by the anodes. Grouping multiple anode strips into a larger virtual pixel reduces the excess information while still maintaining the leakage current that affects the SNR of each event measured in the virtual pixel, by a strip electrode, to be equal to the SNR that exists in one strip electrode and thus is significantly lower than the SNR that can be achieved by a real pixel having the same area as the virtual pixel.

Although the following embodiments are discussed in terms of a computed tomography (CT) imaging system, the embodiments may also be utilized with other imaging systems (e.g., PET, CT/PET, SPECT, nuclear CT, etc.). With the preceding in mind and referring to FIG. 1, a CT imaging system 10 is shown, by way of example. The CT imaging system includes a gantry 12. The gantry 12 has an X-ray source 14 that projects a beam of X-rays 16 toward a detector assembly 15 on the opposite side of the gantry 12. The detector assembly 15 includes a collimator assembly 18, a plurality of detector modules 20, and data acquisition systems (DAS) 32. The plurality of detector modules 20 detect the projected X-rays that pass through a patient 22, and DAS 32 converts the data to digital signals for subsequent processing. Each detector module 20 in a conventional system produces an analog electrical signal that represents the intensity of an incident X-ray beam and hence the attenuated beam as it passes through the patient 22. During a scan to acquire X-ray projection data, gantry 12 and the components mounted thereon rotate about a center of rotation 24 so as to collect attenuation data from a multitude of view angles relative to the imaged volume.

Rotation of gantry 12 and the operation of X-ray source 14 are governed by a control mechanism 26 of CT system 10. Control mechanism 26 includes an X-ray controller 28 that provides power and timing signals to an X-ray source 14 and a gantry motor controller 30 that controls the rotational speed and position of gantry 12. An image reconstructor 34 receives sampled and digitized X-ray data from DAS 32 and performs high-speed reconstruction. The reconstructed image is applied as an input to a computer 36, which stores the image in a mass storage device 38. Computer 36 also receives commands and scanning parameters from an operator via console 40. An associated display 42 allows the operator to observe the reconstructed image and other data from computer 36. The operator supplied commands and parameters are used by computer 36 to provide control signals and information to DAS 32, X-ray controller 28, and gantry motor controller 30. In addition, computer 36 operates a table motor controller 44, which controls a motorized table 46 to position patient 22 and gantry 12. Particularly, table 46 moves (e.g., extends) portions of patient 22 on the patient support through a gantry opening or bore 48. It should be understood that while detectors 20 of CT system 10 may operate in integration mode to develop analog signals proportional to the intensities of the X-Ray beams that they collect, such detectors while operating in spectral CT (known also as high flux photon counting CT), SPECT, PET, MBI and Gamma camera are single photon counting detectors that counts the Gamma photons one by one and output signals that their magnitudes are proportional to the energy of each photon counted.

Figure 2:
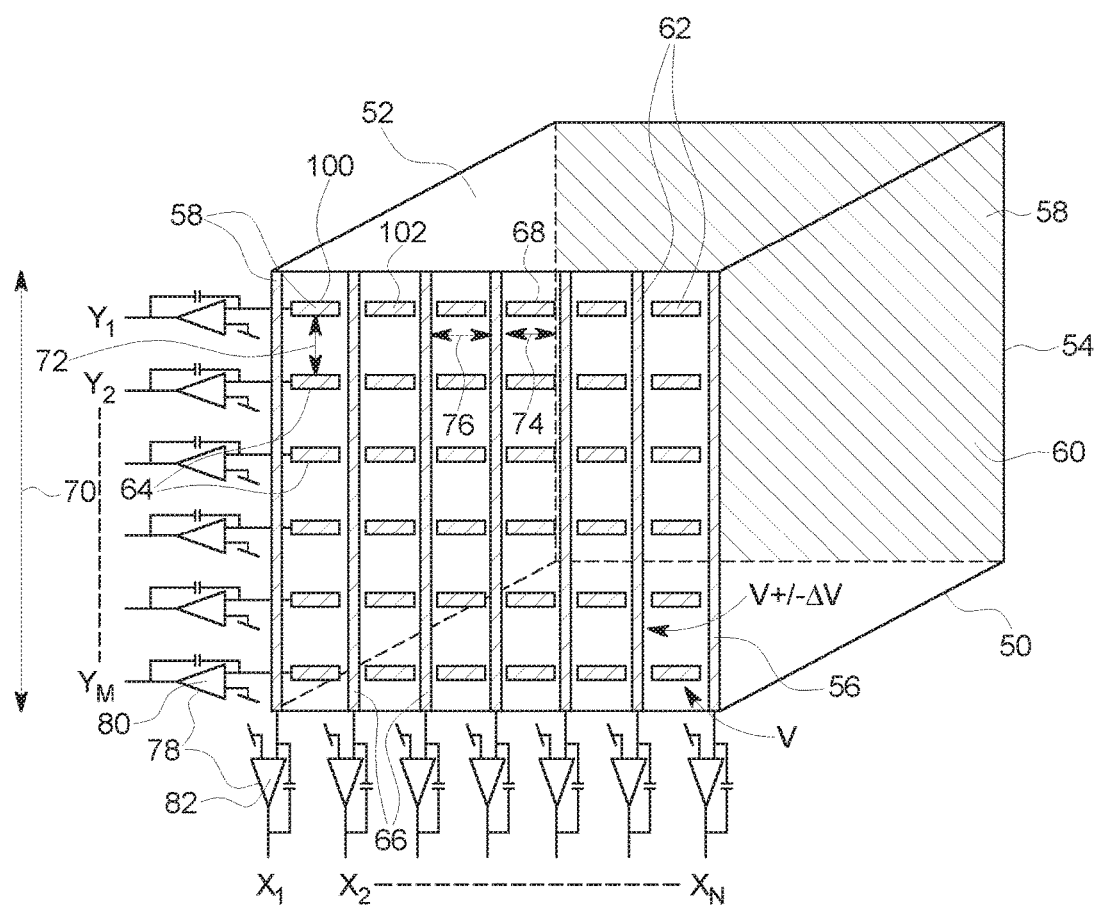
FIG. 2 is a perspective view of an embodiment of a semiconductor radiation detector having at least one set of coplanar strips of anodes having multiple segments or strips.

FIG. 2 is a perspective view of an embodiment of a semiconductor radiation detector 50 having at least one set of coplanar strips of anodes having multiple segments or strips. The semiconductor detector 50 includes a semiconductor layer 52 having a first surface 54 and a second surface 56 opposite the first surface 54. Electrodes 58 are disposed on both surfaces 54, 56. The electrodes 58 include a monolithic cathode 60 disposed on the first surface 54. In certain embodiments, the cathode 60 may include a plurality of strips. The electrodes 58 also include a plurality of anodes 62 (e.g., pixels) disposed on the second surface 56. In certain embodiments, the semiconductor layer 52 may be made of cadmium-zinc-telluride (CZT). In other embodiments, the semiconductor layer 52 may be made of any other suitable semiconductor material capable of detecting ionizing radiation, such as silicon and/or germanium.

In operation of the detector 50, photons of radiation are absorbed by the semiconductor layer 52 to form electrons and holes. The electrons and holes drift to the anodes 62 and the cathode 60, respectively, generating measurable electrical signals on the anodes 62 and the cathode 60. The level of the electrical signals may provide a measure of the energy of the absorbed photon and/or the location of absorption of the photon may correspond to the location of the anodes 62 generating the signal. The energy level and location of the absorbed photons may be used for image reconstruction. For example, detector 50 may be part of a pixelated detector, with an array of detector elements 50 arranged in a grid layout that corresponds to pixels of the reconstructed image. Accordingly, anodes 62 may also referred to herein as pixels 62.

As depicted, the plurality of anodes 62 are disposed on the second surface in a coplanar arrangement. The plurality of anodes 62 includes a first set of anodes or anodes strips 64 (pixelated anode strip-electrodes) disposed along a first direction (e.g., Y-direction) and a second set of anodes or anode strips 66 (pixelated anode strip-electrodes) disposed along a second direction (e.g., X-direction) orthogonal to the first direction. Each anode strip 64 is parallel with respect to the other anode strips 64, while each anode strip 66 is parallel with respect to the other anode strips 66. The number of anode strips 64 in the first set may range from 1 to M, while the number of anode strips 66 in the second set may range from 1 to N. As depicted, each anode strip 64 is divided into a plurality of segments or strips 68 (e.g. along the first direction). This increases the density of the anodes 64 or pixels on the detector 50. The number of segments 68 may vary between 2 to any desired number. Each anode strip 66 is not divided into a plurality of segments or strips but instead extends across the second surface 56. In certain embodiments, each anode strip 66 is divided into a plurality of segments or strips (e.g., along the second direction), while each anode strip 64 is not divided into a plurality of segments or strips. In certain embodiments, each anode strip 64 and each anode strip 66 is divided into a plurality of segments or strips (e.g., along their respective direction). The detector 50 includes at least one anode strip 64, 66 of one of the sets of anode strips 64, 66 having a length that greater than a pitch of the strips 64, 66 of the other set of anode strips 64, 66, while the other set of strips 64, 66 includes at least one anode strip 64, 66 that includes at least one segment having a length that is smaller than a pitch of the other set of strip 64, 66. For example, the anode strip 66 has a length 70 that is greater than a pitch 72 of the anode strips 68, while the anode strip 68 has the segment 68 that has a length 74 that is smaller or less than a pitch 76 of the anode strips 66.

In operation of the detector 50, the sets of anode strips 64, 66 are biased by different high voltages so that only one of the sets of anode strips 64, 66 collects charge, while the other set is non-collecting. For example, a voltage, V, is applied to the first set of anode strips 64, while a different voltage, V±ΔV, is applied to the second set of anode strips 66. Biasing with different high voltages reduces the charge-sharing between the different sets of anode strips 64, 66.

Each anode strip 62 is coupled (e.g., via an electrical connection and distribution plate (see FIG. 3)) to an electronic channel 78 (e.g., coupled to ASICs) to enable the collection of the electronic signal from the anode strip 62. As depicted, electronic channels 78 are coupled to the anode strips 62 on two edges of the second surface 56. In certain embodiments, the electronic channels 78 are coupled to the anode strips 62 on all four edges of the second surface 56. Each anode strip 64 is coupled to a respective electronic channel 80, $Y_M$, while each anode strip 66 is coupled to a respective electronic channel 82, $X_N$. The plurality of segments 68 for a respective anode strip 64 are coupled to a single electronic channel 80. The total number of electronic channels 78 corresponds to N+M (the number of anode strips 66 plus the number of anode strips 64). The two sets of strips include one set having N strips and the other set having M strips. The effective (actual) pixels that such strips produced have square shape and dimensions of P×P when the intersection points between the lines along which the N strips and the M strips are oriented to and aligned with are centered inside the squares of the effective pixels and when P is the pitch between the strips (see pixel 162 in FIG. 8). Accordingly, the coplanar strip arrangement produces N×M effective pixels. In conventional arrangement when each pixel is electrically connected to an electronic channel, there is a need for N×M electronic channels. It is clear that when N>>2 and M>>2 then N×M>>N+M, which means that for the same number of pixels, the number of electronic channels need in conventional configuration is much bigger than the number of channels needed in coplanar strip configuration. Producing a detector with many electronic channels is a technical challenge, thus the use of coplanar arrangement has the great advantage of reducing the number of channels needed from M×N to N+M. However, the use of coplanar strips has the drawback of producing strip electrodes having large area resulting in high leakage current trough the strip electrodes which causes to degradation in the energy resolution of the detector. Accordingly, one of the objectives of the invention is to produce coplanar strip electrodes having small area corresponding to any desired number of effective pixels. Reducing the area corresponding to the strip electrode requires large number of pixels. Large number of pixels have two drawbacks: the first is excess of information (too much information is provided by too many actual pixels) and the second is the small number of events counted in each pixel since the number of photons arriving to the detector is divided between too many pixels. The small number of events counted in each pixel is associated with high statistical noise. To ensure that there is no excess of information and too much statistical noise due to too many effective pixels that each of them collects too small number of photons (events), the following procedure is done as briefly discussed here in the following and in more details in other parts below: selecting the pitch P of the strips and dividing the strips into segments with selected length L so the area P×L corresponding to one strip will ensure the desired low leakage current through the strip. Grouping the effective pixels into larger virtual pixels (such as virtual pixel 164 of FIG. 8) including multiple effective (actual) pixels for reducing the number of pixels to reduce excess of information and reducing statistical noise by summing all the events counted by the actual pixels located inside the virtual pixel. The small pitch of the strips may cause large fraction of events suffering from charge sharing. Accordingly, signals arrived simultaneously from adjacent strips are added to recover charge sharing between strips.

The utilization of the coplanar strips of anode electrodes (having a small pixel pitch, e.g., less than 1 mm or even less than 0.5 mm) enables the reduction in the pixel size of the detector 50, thus, improving the detector-energy resolution and the system spatial-resolution (especially for imaging at short distances from a collimator), while reducing the number of electronic channels 78 (and associated ASICs) on an electronic board of the detector module. Dividing the coplanar strips of anode electrodes (e.g., pixelated anode strip electrodes) into segments reduces the area along the strips and the leakage current associated therewith. In addition, the small pitch pixels improve the sensitivity of the detector 50 and reduces the area between strips for reducing the leakage current in the strip electrodes, resulting with improved energy resolution.

Figure 3:
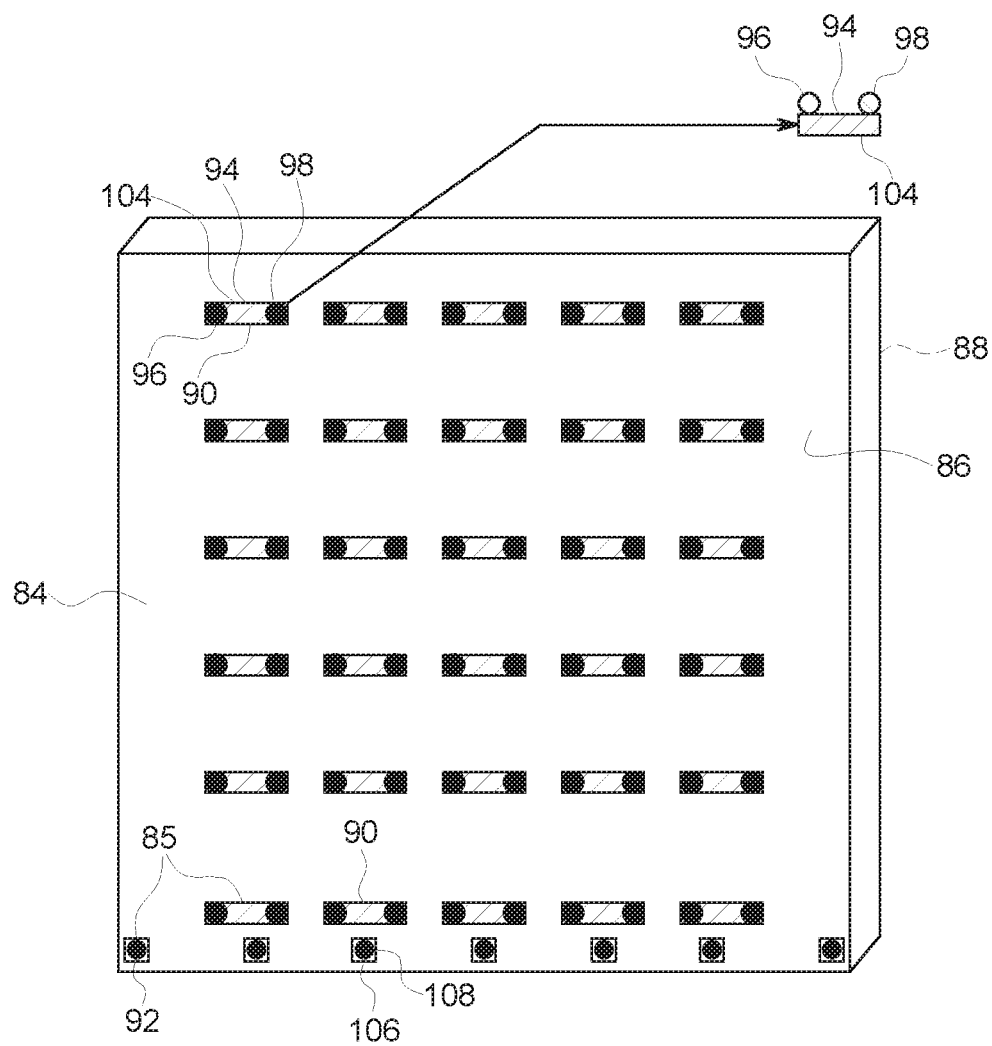
FIG. 3 is a perspective view of an embodiment of a plate (e.g., electrical connection and distribution plate) that couples to the semiconductor radiation detector of FIG. 2.

As mentioned above, the anode strips 62 are coupled to the electronic channels 78 via an electrical connection and distribution plate. Coupling of the radiation detector to the electrical connection and distribution plate forms a detection system that may be coupled to circuitry (e.g., DAS 32) of an imaging system (e.g., CT imaging system 10). FIG. 3 is a perspective view of an embodiment of a plate 84 (e.g., electrical connection and distribution plate) that couples to the semiconductor radiation detector 50 of FIG. 2. The plate 84 electrically connects (via electrical contacts 85) the anode strips 62 to the electronic channels 78. The plate 84 may be made from a printed circuit board. The plate 84 includes a first plate surface 86 and a second plate surface 88 opposite plate surface 86. The electrical contacts 85 are disposed on the first plate surface 86, while one or more ASICS (including the electronic channels 78) may be disposed on the second plate surface 88. The electrical contacts 85 include a first set of electrical contacts 90 that couple the anode strips 64 to the electronic channels 80. The electrical contacts 85 also include a second set of electrical contacts 92 that couple the anode strips 66 to the electronic channels 82. Each electrical contact 90 includes a pad 94 and interconnections 96, 98 (e.g., solder balls) disposed adjacent ends of the pad 94. Each electrical contact 90 electrically couples (e.g., forms an air bridge between) adjacent segments 68 of a respective anode strip 64 without electrically coupling the anode strip 64 to the anode strip 66 disposed between the adjacent segments 68. The height of the interconnections 96, 98 enables the pads 94 to interconnect the segments 68 of a respective 64 anode strip (by forming an air bridge over the anode strip 66) without electrically connecting to the anode strip 66. For example, adjacent segments 100, 102 in FIG. 2 are electrically coupled by electrical contact 104 in FIG. 3. Each electrical contact 92 also includes a pad 106 and an interconnection 108. Each pad 94, 106 is electrically coupled to electronic channels 80, 82, respectively. The pads 94, 106 or the interconnections, such as, interconnections 96, 98 and 108 may be formed of a conductive epoxy. The gap between plate 148 and surface 56 of detector 50 may be filled by underfill to protect detector 50 from humidity and to increase the strength of the mechanical coupling of plate 85 to detector 50

Figure 4:
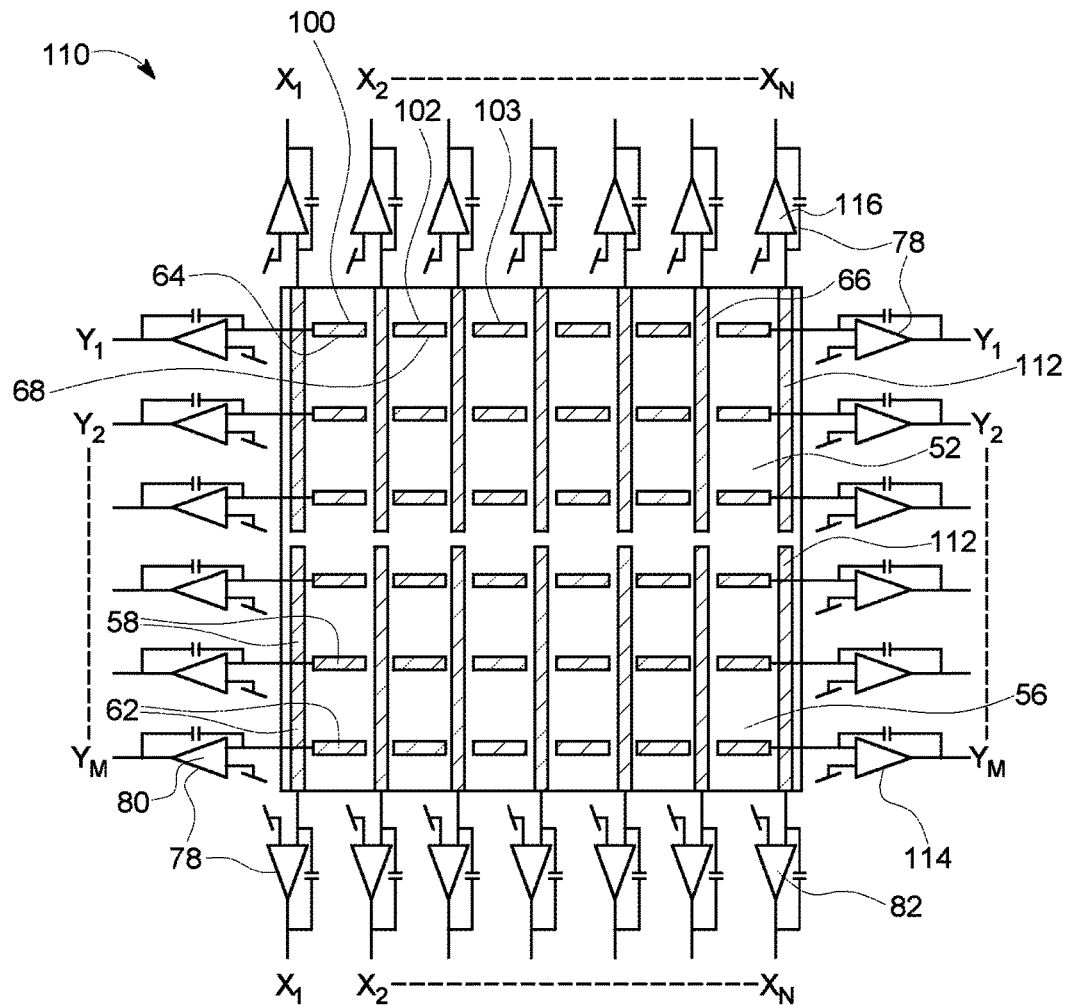
FIG. 4 is a schematic view of an embodiment of a semiconductor radiation detector having both sets of coplanar strips of anodes having multiple segments or strips.

Assuming the resistance of the electrical contacts 85 is negligible with respect to a resistance of the semiconductor layer 52, the resistivity of the anode strips 64, 66 is proportional to the area that is equal to the size of the pitch between strips time the length of the respective strips. The pitch is maintained small to reduce the area between the strips to further reduce the leakage current. To further reduce leakage current, both sets of anode strips 64, 66 may be divided into segments or strips (to reduce the area of the strips). FIG. 4 is a schematic view of an embodiment of a semiconductor radiation detector 110 having both sets of coplanar strips of anodes 64, 66 having multiple segments or strips. In general, the detector 110 is the same as the detector 50 in FIG. 2 except each anode strip 66 of the second set of anode strips 66 is divided into a plurality of segments or strips 112. As depicted, each anode strip 66 is divided into two segments 112. In certain embodiments, each anode strip 66 may be divided into 2 to 10 or more segments 112. Dividing the anode strips 66 into segments 112 also enables the electronic channels 78 to be coupled to the anode strips 62 on all four edges of the second surface 56. As depicted, electronic channels 80, 114 are coupled to the first set of anode strips 64 and electronic channels 82, 116 are coupled to the second set of anode strips 66.

Figure 5:
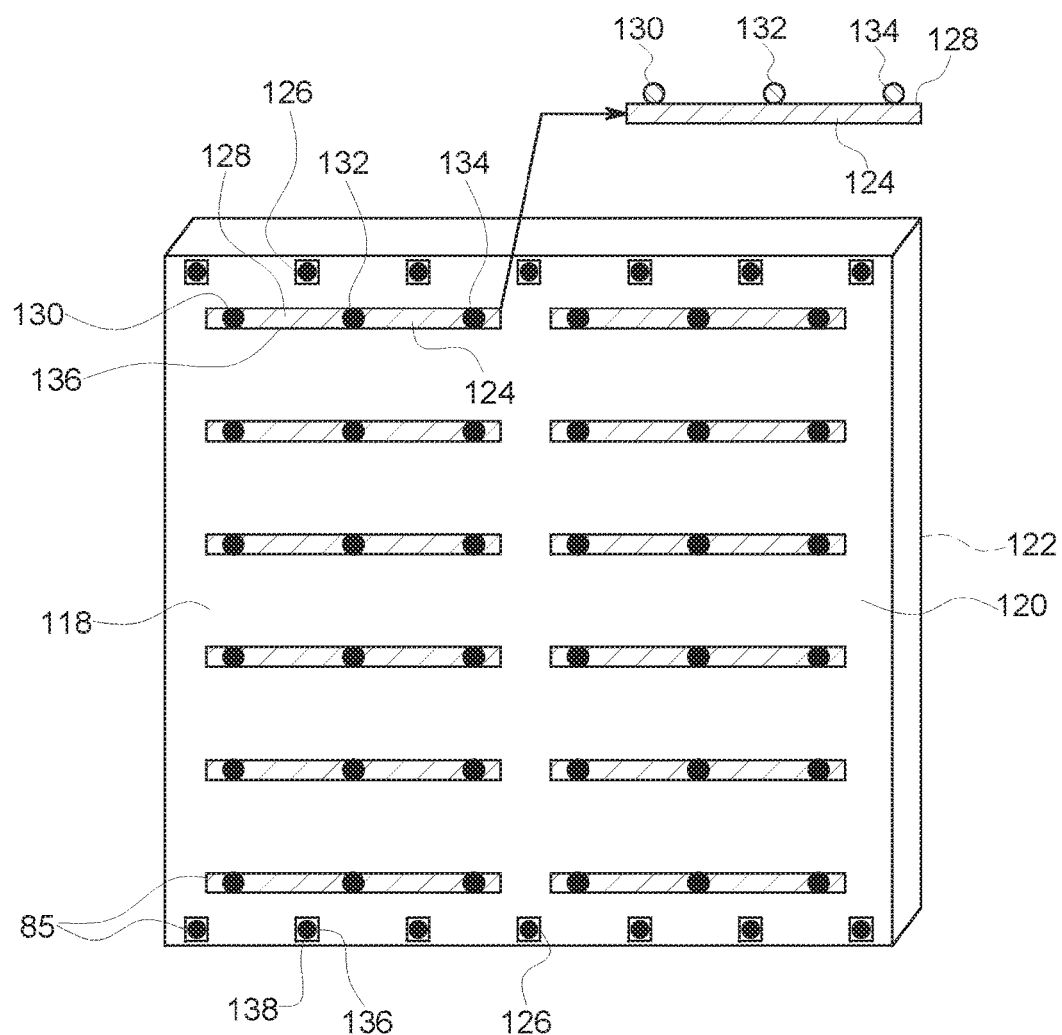
FIG. 5 is a perspective view of an embodiment of a plate (e.g., electrical connection and distribution plate) that couples to the semiconductor radiation detector of FIG. 4.

As above, the anode strips 62 are coupled to the electronic channels 78 via an electrical connection and distribution plate. Coupling of the radiation detector to the electrical connection and distribution plate forms a detection system that may be coupled to circuitry (e.g., DAS 32) of an imaging system (e.g., CT imaging system 10). FIG. 5 is a perspective view of an embodiment of a plate 118 (e.g., electrical connection and distribution plate) that couples to the semiconductor radiation detector 110 of FIG. 4. The plate 118 electrically connects (via electrical contacts 85) the anode strips 62 to the electronic channels 78. The plate 118 may be made from a printed circuit board. The plate 118 includes a first plate surface 120 and a second plate surface 122 opposite plate surface 120. The electrical contacts 85 are disposed on the first plate surface 120, while one or more ASICS (including the electronic channels 78) may be disposed on the second plate surface 122. The electrical contacts 85 include a first set of electrical contacts 124 that couple the anode strips 64 to the electronic channels 80 or 114. The electrical contacts 85 also include a second set of electrical contacts 126 that couple the anode strips 66 to the electronic channels 82 or 116. Each electrical contact 124 includes a pad 128 and interconnections 130, 132, 134 (e.g., solder balls) disposed on the pad 128 corresponding with locations of adjacent segments 68. Each electrical contact 124 electrically couples (e.g., forms an air bridge between) adjacent segments 68 of a respective anode strip 64 without electrically coupling the anode strip 64 to the anode strip 66 disposed between the adjacent segments 68. The height of the interconnections 130, 132, 134 enables the pads 128 to interconnect some of the segments 68 of a respective 64 anode strip (by forming an air bridge over the anode strip 66) without electrically connecting to the anode strip 66. For example, adjacent segments 100, 102, 103 in FIG. 4 are electrically coupled by electrical contact 136 in FIG. 5. Each electrical contact 126 also includes a pad 136 and an interconnection 138. Each pad 124, 136 is electrically coupled to electronic channels 78. The pads 124, 136 and/or interconnections 130, 132, 134 and 138 may be formed of a conductive epoxy.

Figure 6:
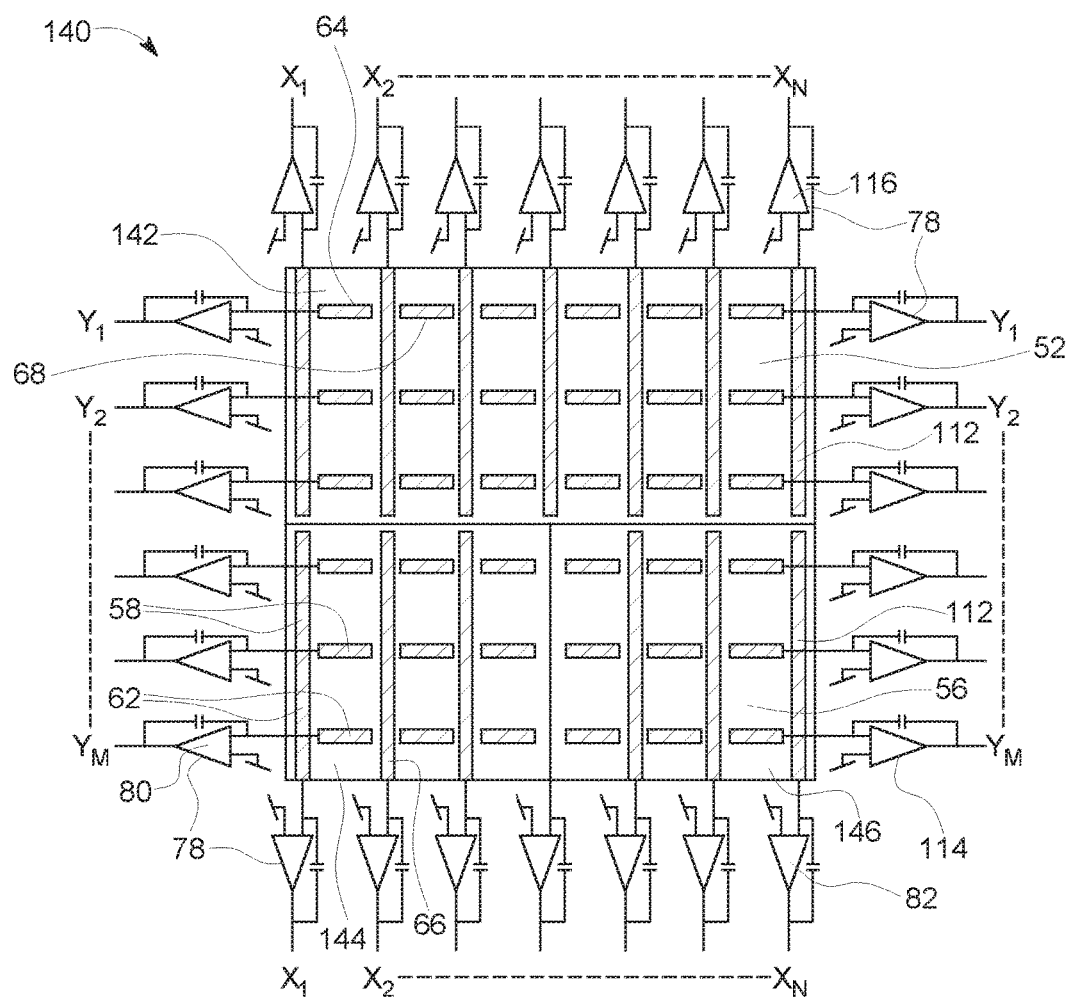
FIG. 6 is a schematic view of an embodiment of a semiconductor radiation detector having the semiconductor layer include multiple semiconductor tiles butted together.

FIG. 6 is a schematic view of an embodiment of a semiconductor radiation detector 140 having the semiconductor layer 52 include multiple semiconductor tiles butted together. In general, the detector 140 is the same as the detector 110 in FIG. 4 except the semiconductor layer 52 is divided into chunks (e.g., CZT chunks) or tiles of semiconductor material. As depicted, the semiconductor layer 52 includes three tiles 142, 144, 146 abutted together. In other embodiments, the semiconductor layer may include a different number of tiles. In certain embodiments, one or more tiles may be different in size. As depicted, tiles 144, 146 are similar in size but different in size from tile 142. In certain embodiments, each of the tiles may have the same size. Each tile 142, 144, 146 is electrically isolated from the others. Also, each tile 142, 144, 146 includes the same pitch for the plurality of anodes 62 (e.g., sets of anode strips 64, 66). As depicted, some of the anode strips 64, 66 extend across more than one tile 142, 144, 146.

Figure 7:
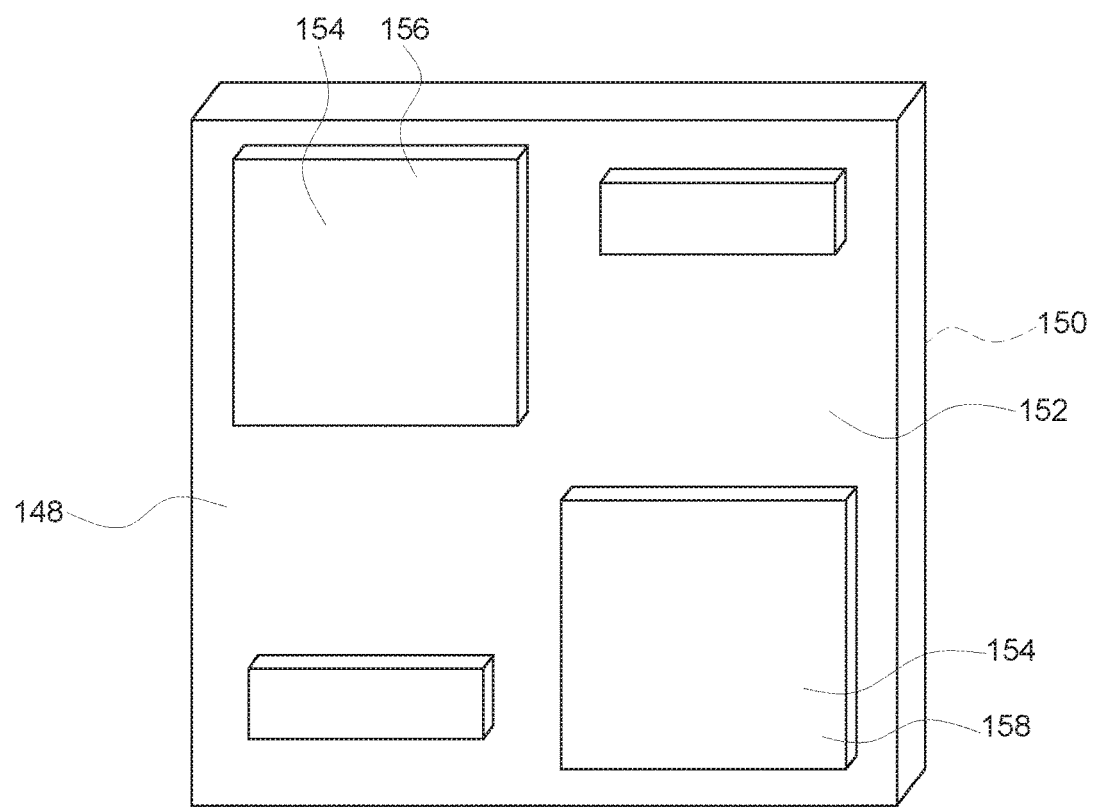
FIG. 7 is a perspective view of an embodiment of a plate (e.g., electrical connection and distribution plate) that couples to the semiconductor radiation detector of FIG. 6.

The detector 140 in FIG. 6 may be electrically coupled to a plate 148 (similar to the electrical connection and distribution plate 118 described in FIG. 5) as depicted in FIG. 7. The plate 148 includes a first plate surface 150 and a second plate surface 152 opposite surface 150. Electrical contacts 85 (similar to those shown in FIG. 5) may be disposed on the first plate surface 150. ASICs 154 (each including one or more of the electronic channels 78, 80, 82 and 116) may disposed on or coupled to the second plate surface 152 (e.g., forming a chip-on-board). Electrical routing makes electrical contact between the pads 124, 136 on the first plate surface 150. The inputs and outputs of the ASICs 154 are connected to the electrical routing of the second plate surface 152 via ball grid arrays. In certain embodiments, the ASICs 154 may be connected to the electrical routing of the second plate surface 152 via wire-bonding. As depicted, at least two ASICs 156, 158 are disposed on the second plate surface 152. In certain embodiments, a different number of ASICS 154 may be disposed on the second plate surface 152. Each ASIC 156, 158 may be electrically coupled to one or more tiles of the semiconductor layer 52. It should be noted that connecting and distribution plate 148 may electrically connect between the segmented strips of each set of strips across multiple tiles of semiconductor detector-plates. In this situation, the electronic channels may be connected to the anode strips along only two sides of the detector. In case that connecting and distribution plate 148 do not connect between the strip segments of each set of strips across multiple tiles of semiconductor detector-plates (CZT), the electronic channels may be connected to the anode strips along all the four sides of the detector and thus the strips are shorter and their leakage current is reduced.

Figure 8:
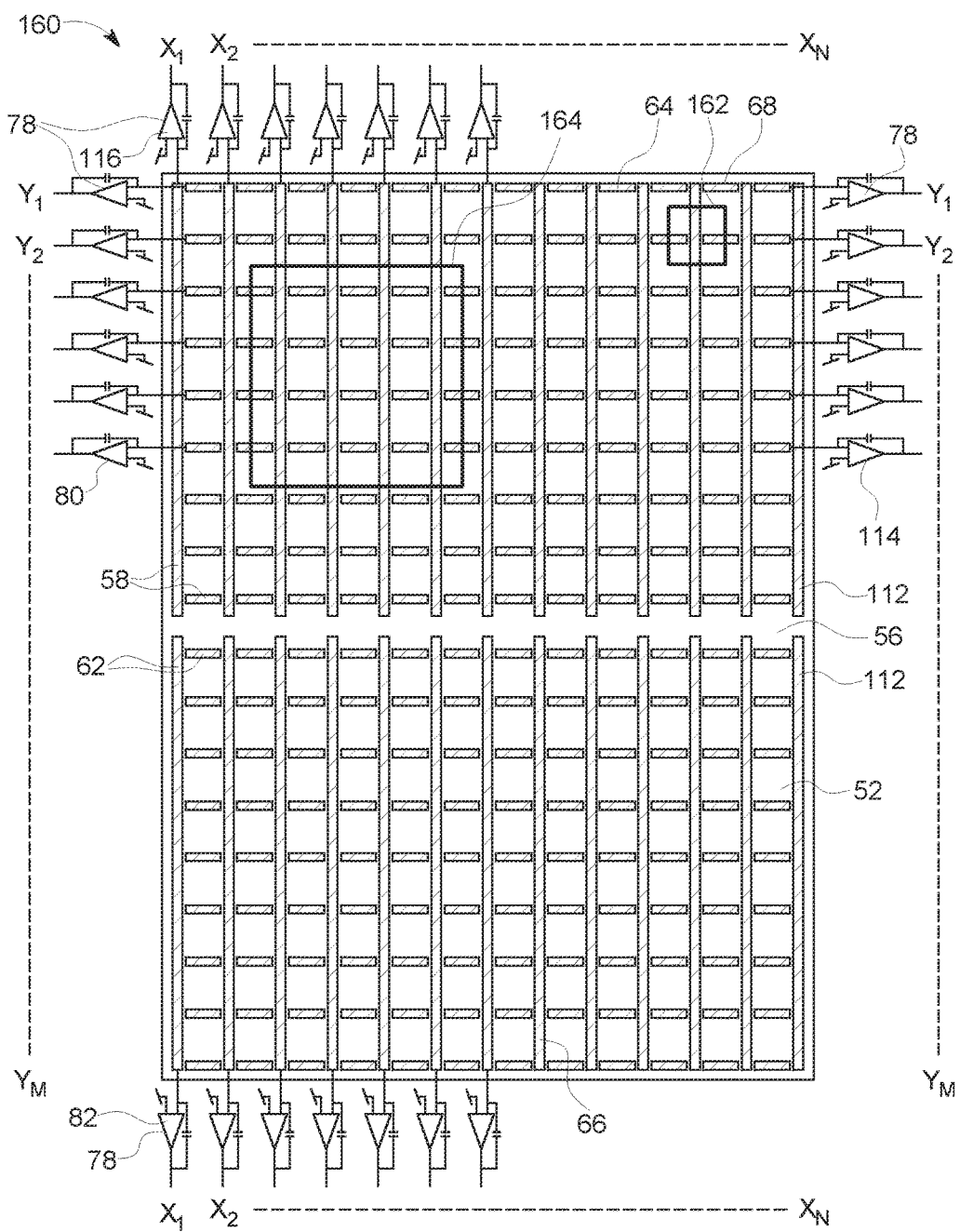
FIG. 8 is a schematic view of an embodiment of a semiconductor radiation detector illustrating the division of anodes (e.g., pixels) into a virtual pixel.

FIG. 8 is a schematic view of an embodiment of a semiconductor radiation detector 160 illustrating the division of anodes 62 (e.g., pixels) into a virtual pixel. The radiation detector 160 in FIG. 8 is similar to the radiation detector 110 in FIG. 4. The anodes 62 are divided into segments or segmented strips as described above. In particular, the small pitch of anodes strips 64, 66 and the length of their respective segments 68, 112 are selected to ensure a small area between the anode strips 64, 66 to minimize leakage current. However, due to the small pitch of the anode strips 64, 66, a significant number of events (e.g., absorption of radiation photons) that occur may result in charge sharing (e.g., splitting of charge due to an event) between the adjacent anode strips 64, 66. In order to recover charge sharing, simultaneous signals from adjacent strips 64, 66 may be added (e.g., via neighbor summing) to compensate for charge loss (e.g., via processing circuitry of the detection system and/or imaging system). For example, simultaneous signals (e.g., due to one or more events) collected from the adjacent segments 68, 112 within pixel 162 may be added together for charge-sharing recovery. Neighbor summing may be defined as summing signals received in adjacent pixels (anodes 62) to recover the energy of neighboring pixels into one signal that is located within the photo-electric absorption energy window.

In the coplanar configuration of the detector 160, each pixel may include a square area defined by intervals of ±a half pitch around a cross-section point between two orthogonal anode strips 64, 66 in which events appear simultaneously (as illustrated within pixel 162 in FIG. 8). The pitch of the anode strips 64, 66 are small to maintain leakage current. However, the pitch of the anode strips 64, 66 is so small that the detector 160 includes too many pixels 162 providing too much information while reducing the number of events occurring in each pixel 162 resulting in high statistical noise. To reduce the amount of excess information and statistical noise, the pixels 162 (e.g., actual real pixels) may be grouped together into a virtual pixel 164 (e.g., configurable combination of pixels 162 performed in software, hardware, or combination thereof) by the processing circuitry of the detection system and/or imaging system. The number of pixels 162 that may be grouped together to form the virtual pixel 164 may vary between 2 to 10 or more pixels 162. The processing circuitry may utilize the virtual pixels 164 by taking the number of counts (e.g., events including events recovered for charge sharing) for each pixel 162 within a respective virtual pixel 164 and adding them together to form a total number of counts (e.g., events) for the respective virtual pixel (e.g., to reduce excess information and statistical noise).

Figure 9:
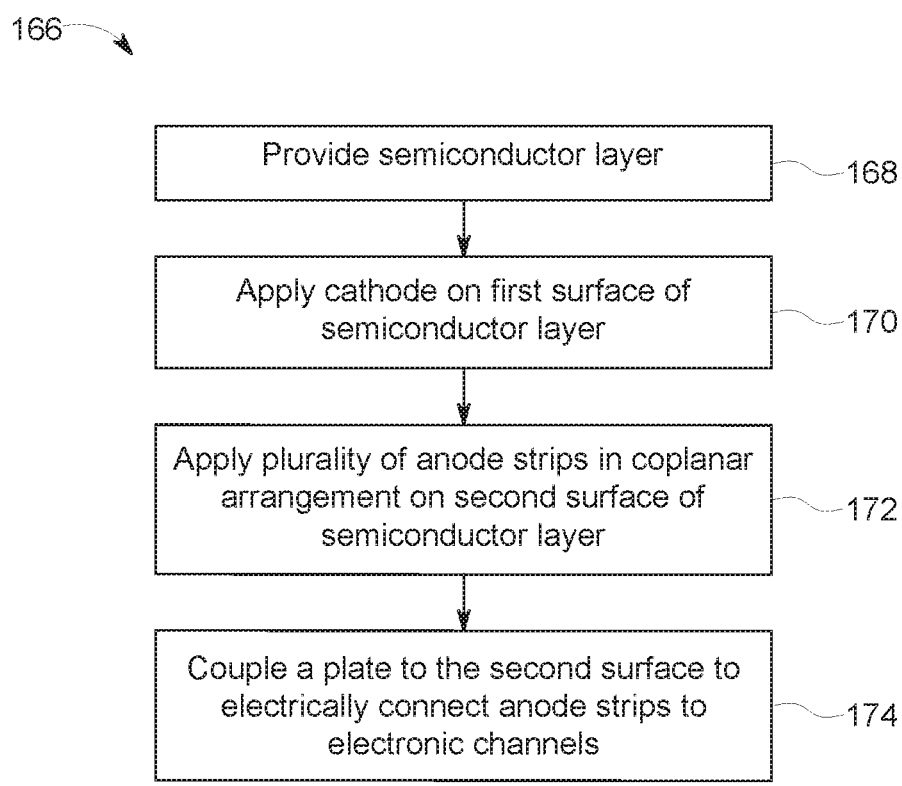
FIG. 9 is a flow chart of an embodiment of a method for manufacturing a radiation detection system having a semiconductor radiation detector having small pitch anodes (e.g., strips and/or segmented strips providing the events locations similar to small pixels)

FIG. 9 is a flow chart of an embodiment of a method 166 for manufacturing a radiation detection system having a semiconductor radiation detector having small pitch anodes 62 (e.g., pixels). Some of the steps of the method 166 may be performed simultaneously or in a different order. The method 166 includes providing the semiconductor layer 52 (e.g., made of CZT) (block 168). In certain embodiments, providing the semiconductor layer 52 includes abutting multiple chunks or tile of CZT together. The method 166 also includes applying the cathode 60 (e.g., monolithic cathode) on the first surface 54 of the semiconductor layer 52 (block 170). In certain embodiments, the method 166 further includes applying the anode strips 62 in a coplanar arrangement on the second surface 56 of the semiconductor layer 52 (block 172). For example, the first set of anode strips 64 may be applied in a first direction, while the second set of anode strips 66 may be applied in a second direction orthogonal to the first direction. One of the sets of the anode strips 64, 66 or both sets of the anode strips 64, 66 may be divided into a plurality of segments or strips along their respective direction. The number and arrangement of the anode strips 62 and the length of their segments depend—on the desired pitch size for the anodes 62 and predetermined leakage current of the anodes 62. The method 166 even further includes coupling a plate (e.g., electrical connection and distribution plate) to the second surface 56 to electrically connect the anode strips 62 to the electronic channels 78, 80, 82, 114 and 116 of the ASICs as described above (block 174). Depending on the arrangement of the anode strips 62, the strips 62 may be coupled to electronic channels on some or all of the edges of the second surface 56. The plate does not form any electrical between the two sets of anode strips 64, 66.

Figure 10:
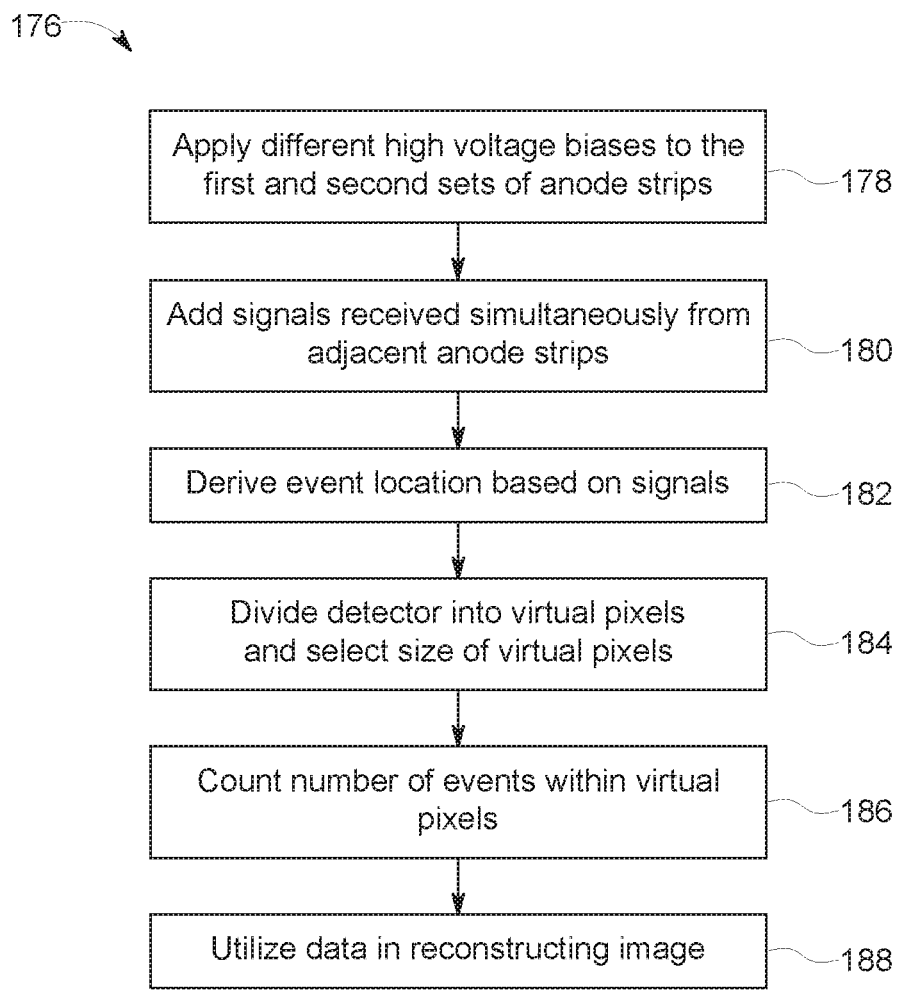
FIG. 10 is a flow chart of an embodiment of a method for utilizing a radiation detection system having a semiconductor radiation detector having small pitch anodes (e.g., strips and/or segmented strips providing the events locations similar to small pixels).

FIG. 10 is a flow chart of an embodiment of a method 176 for utilizing a radiation detection system having a semiconductor radiation detector having small pitch anodes 62 (e.g., pixels) in a coplanar arrangement. One or more of the steps of the method 176 may be performed by processing circuitry (e.g. of the DAS 32 and/or other component of the imaging system) executing instructions stored on a memory. One or more steps may be performed simultaneously or in an order different from FIG. 10. The method 176 includes applying different high voltage biases to the first and second sets of anode strips 64, 66 so that only one of the sets anode strips 64, 66 acts as the charge collecting set of anode strips (block 178), resulting with reduced charge sharing between the two sets of strips and reduced leakage current in the set of strips having lower high-voltage bias. The set of anode strips 64, 66 with the higher high-voltage bias applied acts as the charge collecting set, while the set of anode strips 64, 66 with the lower high-voltage bias applied acts the non-collecting set. The method 176 also includes, in each set of the anode strips 64, 66, adding signals (via neighbor summing) received simultaneously (coincidence) at adjacent anode strips 64, 66 in which the signals are produced simultaneously (block 180). For example, two adjacent anode strips 64 receiving signals simultaneously (which are produced simultaneously) are added at the two respective outputs of the electronic channels corresponding to the two adjacent anode strips 64, while two adjacent strips 66 receiving the same signals simultaneously are added at the two respective outputs of the electronic channels corresponding to the two adjacent anode strips 66. Adding the signals enables charge-sharing recovery. Even though one of the sets of strips is biased with a potential that is lower than the potential of the other set of strips and acting as a non-collecting set of strips, still some small amount of events may suffer from charge sharing due to charge splitting between strips that belong to different sets of strips. Accordingly, charge sharing recovery may be performed by summing all the signals produced simultaneously in different strips regardless to which set of strips they belong. The method 176 further includes based on the signals received simultaneously at the adjacent anode strips 64, 66 deriving the event location (e.g., location of absorption of radiation photon) (block 182). The method 176 even further includes dividing the detector into multiple virtual pixels 164 and selecting the size of the virtual pixels 164 to include multiple anode strips of at least one of the sets of anode strips 64, 66 and at least one anode strip of the other set of anode strips 64, 66 (block 184). The number of pixels 162 utilized in a virtual pixel may range from between 2 to 10 or more pixels 162. The method 176 still further includes counting the number of events (e.g., absorption of radiation photon) for each pixel 162 within a respective virtual pixel 164 and adding them together to form a total number of counts (e.g., events) for the respective virtual pixel 164 (e.g., to reduce excess information and statistical noise) (block 186). The method 176 includes utilizing the data (e.g., the energy level and location of the absorbed photons) from the virtual pixels 164 in reconstructing an image (block 188).

An example detector (e.g., 40 mm by 40 mm having 4 ASICs with 128 channels each when the detector is assembled from 4 tiles of CZT, such as tile 146 in FIG. 6 and when the electronic channels are coupled to detector 50 along its 4 sides) utilizing the embodiments above (e.g., each tile out of the 4 tiles, such as tile 146 may include two sets of strips, such as, sets of segmented anode strips 58 and 66) may include in each CZT tile two sets of 64 strips corresponding to 64×64=4096 actual (or effective) pixels. Thus, the whole detector 50 may include 4×4096=16,384 actual pixels formed by the anode strips. The strip pitch may be ((40/2)/64)=0.31 mm, the strip length (assuming each strip includes two segments) may be 20 mm, and the strip area for each strip may be 0.31×20=6.2 mm$^2$. Assuming the number of actual pixels in each virtual pixel is 3×3=9, the number of virtual pixels in the detector is 1,820. The number of electronic channels connected to each side or edge of the detector would be 128. In case that plate 148 connects the segmented strips across multiple CZT tiles, the electrical channels may be coupled to detector 50 along two sides only when each side is coupled to 256 electronic channels. In this case the strip pitch is 40/256=0.155 mm and the strip length is 40 mm resulting with strip area of 4×1.55=6.2 mm$^2$. Such a detector includes 256×256=65,536 channels. In case that we would like to have the same number (18,634) of virtual pixels as is in the example above, each virtual pixel should include 65,536/1820=36 actual pixels. This means that each virtual pixel may include 6×6=36 actual pixels.

Technical effects of the disclosed embodiments include providing a semiconductor radiation detector having dense small pitch anodes (e.g., a pitch of less 1 mm or even less than 0.5 mm) in a coplanar arrangement on a surface of a semiconductor layer. The small pitch anodes include a first set of anode strips disposed along first direction and a second set of anode strips disposed along a second direction orthogonal to the first direction. One or more sets of the anode strips may include small pitch to reduce the area between anode strips and may be divided into segments or strips along their respective direction to reduce the area along anode strips for reducing the area corresponding to each strip to reduce leakage current. Neighbor summing may be utilized in charge-sharing recovery, while virtual pixels may be utilized to reduce excess information and statistical noise. Thus, the disclosed embodiments may increase the sensitivity of the detector while improving the detector-energy resolution and system spatial-resolution.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A radiation detection system, comprising:
a radiation detector, comprising:
a semiconductor layer having a first surface and a second surface opposite the first surface;
a monolithic cathode disposed on the first surface; and
anode strip-electrodes disposed on the second surface in a coplanar arrangement, wherein the anode strip-electrodes comprise a first set of anode strip-electrodes disposed along a first direction and a second set of anode strip-electrodes disposed along a second direction orthogonal to the first direction, each anode strip-electrode of the first set of anode strip-electrodes comprises a first respective plurality of non-contiguous strip segments disposed co-linearly along the first direction with gaps between adjacent non-contiguous strip segments, and each anode strip-electrode of the second set of anode-strip electrodes comprises a second respective plurality of segments disposed along the second direction.

2. The radiation detection system of claim 1, comprising an electrical connection and distribution plate coupled to the radiation detector and configured to electrically connect the anode strip-electrodes to electronic channels without electrically connecting the first and second sets of anode strip-electrodes to each other, wherein the electrical connection and distribution plate comprises a first plurality of pads having interconnects disposed on a first plate surface and configured to electrically interconnect the respective first plurality of strip segments for each respective anode strip-electrode of the first set of anode strip-electrodes, and a second plurality of pads having interconnects disposed on the first plate surface and configured to electrically interconnect the respective second plurality of segments for each respective anode-strip electrode of the second set of anode strip-electrodes.

3. The radiation detection system of claim 2, wherein the electrical connection and distribution plate comprises a plurality of application-specific integrated circuits having electronic channels disposed on a second plate surface opposite the first plate surface, and wherein the anode strip-electrodes are coupled to the electronics channels, via the electrical connection and distribution plate, on all edges of the second surface.

4. The radiation detection system of claim 3, wherein the semiconductor layer comprises a plurality of cadmium zinc telluride (CZT) tiles butted together, and least one of the first set or the second set of anode strip-electrodes extends across at least two CZT tiles of the plurality of CZT tiles.

5. The radiation detection system of claim 1, wherein the second respective plurality of segments disposed along the second direction comprise non-contiguous strip segments disposed co-linearly along the second direction with gaps between adjacent non-contiguous strip segments.

6. A method of forming a radiation detection system, comprising:
providing a semiconductor layer having a first surface and a second surface opposite the first surface;
applying a monolithic cathode on the first surface; and
applying anode strip-electrodes on the second surface in a coplanar arrangement, wherein the anode strip-electrodes comprise a first set of anode strip-electrodes disposed along a first direction and a second set of anode strip-electrodes disposed along a second direction orthogonal to the first direction, each anode strip-electrode of the first set of anode strip-electrodes comprises a first respective plurality of non-contiguous strip segments disposed co-linearly along the first direction with gaps between adjacent non-contiguous strip segments, and each anode strip-electrode of the second set of anode-strip electrodes comprises a second respective plurality of segments disposed along the second direction.

7. The method of claim 6, comprising coupling an electrical connection and distribution plate to the second surface to electrically connect the anode strip-electrodes to electronic channels without electrically connecting the first and second sets of anode strip-electrodes to each other, wherein the electrical connection and distribution plate comprises a first plurality of pads having interconnects disposed on a first plate surface and configured to electrically interconnect the respective first plurality of strip segments for each respective anode strip-electrode of the first set of anode strip-electrodes, and a second plurality of pads having interconnects disposed on the first plate surface and configured to electrically interconnect the respective second plurality of segments for each respective anode-strip electrode of the second set of anode strip-electrodes.

8. The method of claim 6, wherein providing the semiconductor layer comprises abutting together a plurality of cadmium zinc telluride (CZT) tiles butted together, and applying the anode strip-electrodes comprises applying the anode strip-electrodes on the second surface so that at least one of the first set or second set of anode strip-electrodes extends across at least two CZT tiles of the plurality of CZT tiles.

9. The method of claim 6, wherein the second respective plurality of segments disposed along the second direction comprise non-contiguous strip segments disposed co-linearly along the second direction with gaps between adjacent non-contiguous strip segments.

* * * * *